United States Patent [19]

Lefebvre et al.

[11] Patent Number: 5,798,027
[45] Date of Patent: *Aug. 25, 1998

[54] PROCESS FOR DEPOSITING OPTICAL THIN FILMS ON BOTH PLANAR AND NON-PLANAR SUBSTRATES

[75] Inventors: Paul M. Lefebvre; James W. Seeser; Richard Ian Seddon; Michael A. Scobey, all of Santa Rosa, Calif.; Barry W. Manley, Boulder, Colo.

[73] Assignee: Optical Coating Laboratory, Inc., Santa Rosa, Calif.

[*] Notice: The term of this patent shall not extend beyond the expiration date of Pat. No. 5,225,057.

[21] Appl. No.: 272,104

[22] Filed: Jul. 7, 1994

Related U.S. Application Data

[60] Continuation of Ser. No. 17,670, Feb. 11, 1993, abandoned, which is a division of Ser. No. 794,308, Nov. 14, 1991, Pat. No. 5,225,057, which is a continuation of Ser. No. 604,356, Oct. 26, 1990, abandoned, which is a continuation of Ser. No. 381,606, Jul. 18, 1989, abandoned, which is a continuation-in-part of Ser. No. 154,177, Feb. 8, 1988, Pat. No. 4,851,095.

[51] Int. Cl.$^6$ ..................................................... C23C 14/34
[52] U.S. Cl. ........................ 204/192.26; 204/192.28; 204/192.29; 204/298.26
[58] Field of Search .................. 204/192.26–192.29, 204/298.26; 427/162–169

[56] References Cited

U.S. PATENT DOCUMENTS

| 3,576,729 | 4/1971 | Sigournay et al. | 204/192.11 |
|---|---|---|---|
| 3,635,811 | 1/1972 | Lane | 204/192.15 |

(List continued on next page.)

FOREIGN PATENT DOCUMENTS

| 0269446 | 6/1988 | European Pat. Off. | 204/298.6 |
|---|---|---|---|
| 2183557 | 12/1973 | France | 204/298.05 |
| 128714 | 12/1977 | Germany . | |
| 62-287073 | 12/1987 | Japan | 204/298.11 |
| 2180262 | 3/1987 | United Kingdom | 204/192.2 |

OTHER PUBLICATIONS

Schiller et al, "Alternating ion plating—A method of high–rate ion vapor deposition," *J. Vac. Sci. Technol.*, vol. 12, No. 4, pp. 858–864, Jul./Aug., 1975.

Anderson et al, "Magnetron reactive sputtering deposition of $Cu_2S/CdS$ solar cells," *Proceedings, 2nd European Community Photovoltaic Solar Energy Conference*, pp. 890–897, 1979.

Schiller et al, "Reactive d.c. sputtering with the magnetron–plasmatron for tantalum pentoxide and titanium dioxide films," *Thin Solid Films*, vol. 63, pp. 369–375, Apr., 1979.

Schiller et al, "Advances in high rate sputtering with magnetron–plasmatron processing and instrumentation," *Thin Solid Films*, vol. 64, pp. 455–467, Apr., 1979.

Kienel et al, "Cold light mirrors," *Industrial Research/Development*, pp. 135–139, Jan., 1980.

Springer et al, "Characterization of aluminum—aluminum nitride coatings sputter deposited using the pulsed gas process," *J. Vac. Sci. Technol.*, vol. 20, No. 3, pp. 462–465, Mar., 1982.

(List continued on next page.)

*Primary Examiner*—Nam Nguyen
*Attorney, Agent, or Firm*—Workman, Nydegger & Seeley

[57] ABSTRACT

A rotary cylindrical sputtering system incorporates separate, separately-controlled linear magnetron sputter deposition and reaction zones for sputter depositing materials such as refractory metals and forming oxides and other compounds and alloys of such materials. In one aspect, the associated process involves rotating or translating workpieces past the differentially pumped, atmospherically separated, sequentially or simultaneously operated deposition and reaction zones and is characterized by the ability to form a wide range of materials, by high throughput, and by the ability to form durable optical quality thin films of nominal refractive indices and controlled coating thickness, including both constant and selectively varied thickness profiles.

18 Claims, 7 Drawing Sheets

U.S. PATENT DOCUMENTS

| | | | |
|---|---|---|---|
| 3,829,373 | 8/1974 | Kuehnle | 204/298.24 |
| 4,046,666 | 9/1977 | McClanahan et al. | 204/298.04 |
| 4,128,466 | 12/1978 | Harding et al. | 204/192.28 |
| 4,142,958 | 3/1979 | Wei et al. | 204/192.11 |
| 4,151,059 | 4/1979 | Kuehnle | 204/192.26 |
| 4,151,064 | 4/1979 | Kuehnle | 204/298.28 |
| 4,261,808 | 4/1981 | Walter | 204/298.25 |
| 4,298,444 | 11/1981 | Chahroudi | 204/192.14 |
| 4,313,815 | 2/1982 | Graves, Jr. et al. | 204/298.25 |
| 4,361,114 | 11/1982 | Gurev | 118/723 |
| 4,361,472 | 11/1982 | Morrison, Jr. | 204/192.12 |
| 4,392,931 | 7/1983 | Maniv et al. | 204/192.12 |
| 4,420,385 | 12/1983 | Hartsough | 204/192.23 |
| 4,424,103 | 1/1984 | Cole | 204/192.11 |
| 4,434,037 | 2/1984 | Crank | 204/192.12 |
| 4,492,620 | 1/1985 | Matsuo et al. | 204/192.12 |
| 4,562,093 | 12/1985 | Mario et al. | 427/109 |
| 4,588,490 | 5/1986 | Cuomo et al. | 204/298.06 |
| 4,591,418 | 5/1986 | Snyder | 204/192.16 |
| 4,622,919 | 11/1986 | Suzuki et al. | 118/718 |
| 4,637,869 | 1/1987 | Glocker et al. | 204/192.11 |
| 4,655,167 | 4/1987 | Nakamura et al. | 118/718 |
| 4,661,229 | 4/1987 | Hemming et al. | 204/192.13 |
| 4,674,621 | 6/1987 | Takahashi | 198/378 |
| 4,675,096 | 6/1987 | Tateishi et al. | 204/298.25 |
| 4,692,233 | 9/1987 | Casey | 204/298.25 |
| 4,693,803 | 9/1987 | Casey et al. | 204/298.24 |
| 4,777,908 | 10/1988 | Temple et al. | 118/719 |
| 4,793,908 | 12/1988 | Scott et al. | 204/192.26 |
| 4,798,663 | 1/1989 | Herklotz et al. | 204/298.06 |
| 4,824,544 | 4/1989 | Mikalesen et al. | 204/298.06 |
| 4,834,023 | 5/1989 | Saitoh et al. | 118/730 |
| 4,842,704 | 6/1989 | Collins et al. | 204/192.24 |
| 4,862,032 | 8/1989 | Kaufman et al. | 313/359.1 |
| 5,225,057 | 7/1993 | LeFebvre et al. | 204/192.13 |

OTHER PUBLICATIONS

Scherer et al, "Reactive high rate d.c. sputtering of oxides," Apr., 1984.

Ceasar et al, "Multiple drum fabrication for ion beam deposited a–Si:H photoreceptors," *Xerox Disclosure Journal*, vol. 9, No. 3, pp. 173–175, May/Jun. 1984.

Carmichael et al, "Coating techniques offer solutions to industrial needs," *Optical Engineering Reports*, p. 3A, Jul., 1987.

Kaufman et al, "End–hall ion source," *J. Vac. Sci. Technol. A*, vol. 5, No. 4, Jul./Aug., 1987.

Makous et al, "Superconducting and structural properties of sputtered thin films of $YBa_2Cu_3O_{7-x}$," *Appl. Phys. Letts.*, vol. 51, No. 25, pp. 2164–2166, Dec. 21, 1987.

Todorov et al, "Oxidation of silicon by a low–energy ion beam: Experiment and model," *Appl. Phys. Letts.*, vol. 52, No. 1, pp. 48–50, Jan. 4, 1988.

"Hollow Cathodes and Hollow Cathode Neutralizers", brochure by Ion Tech., Inc., Jan. 1988.

"ECR Plasma Source", brochure by Applied Science and Technology, Inc., Nov., 1988.

"C–Mag Rotatable Magnetron Cathode", brochure by Airco Coating Technology, 1988.

"1989 Photonics Technology Trends", *Photonics Spectra*, Jan., 1989.

"Mark I Gridless Ion Source", brochure by Commonwealth Scientific Corporation (date unknown).

Mattox, "Ion Plating Technology," *Deposition Technologies for Films and Coatings*, pp. 244–260, (date unknown).

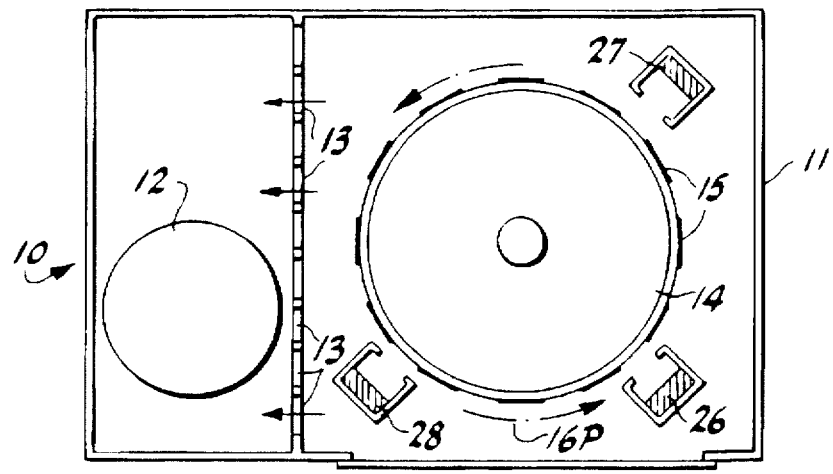
FIG. 2
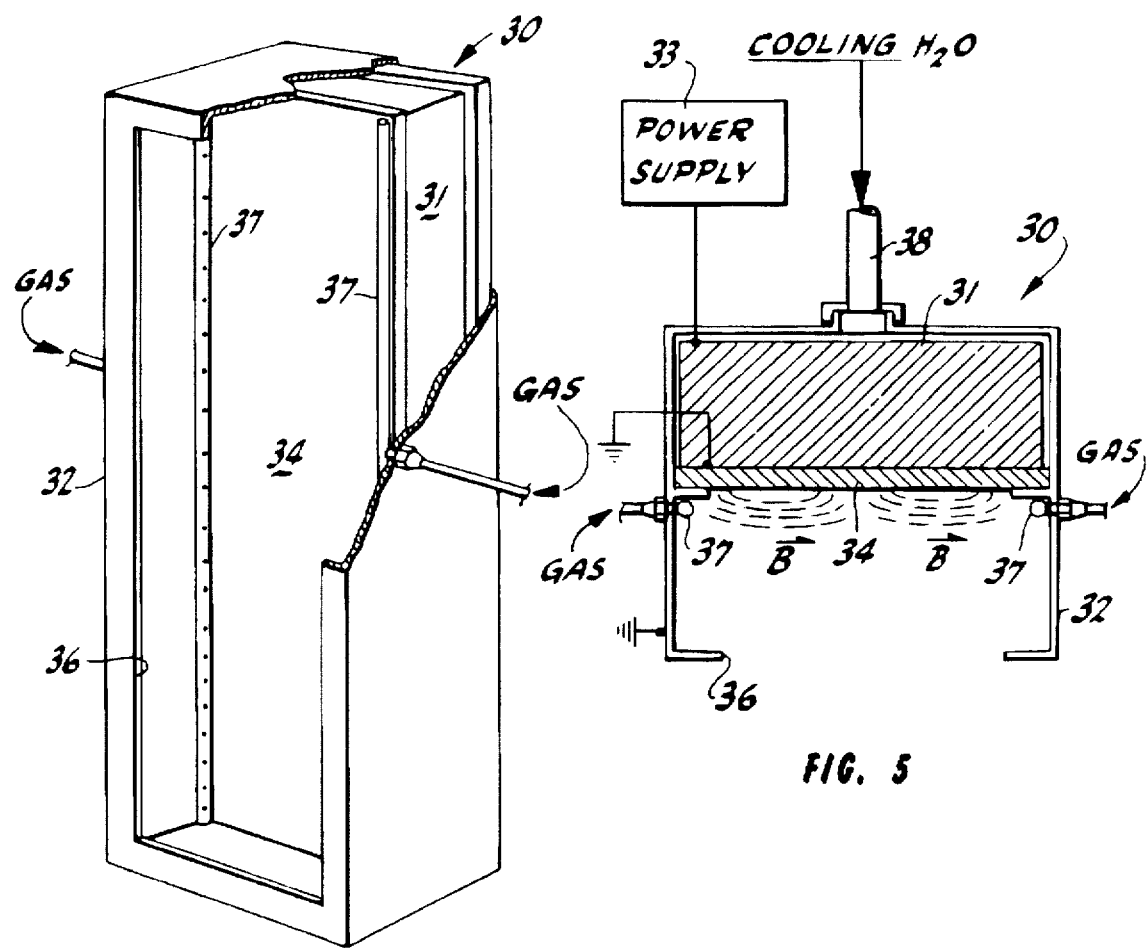
FIG. 4
FIG. 5

PROCESS FOR DEPOSITING OPTICAL THIN FILMS ON BOTH PLANAR AND NON-PLANAR SUBSTRATES

I. CROSS-REFERENCE TO RELATED APPLICATION

This is a continuation of co-pending application Ser. No. 08/017,670, filed Feb. 11, 1993 now abandoned; which is a divisional application of co-pending application Ser. No. 07/794,308, filed Nov. 14, 1991, now U.S. Pat. No. 5,225,057; which is a continuation of co-pending application Ser. No. 07/604,356, filed Oct. 26, 1990, now abandoned; which is a continuation of co-pending application Ser. No. 07/381,606, filed Jul. 18, 1989, now abandoned; which is a continuation-in-part of application Ser. No. 154,177, filed Feb. 8, 1988, now U.S. Pat. No. 4,851,095.

II. BACKGROUND OF THE INVENTION

The present invention relates to processes and apparatus for high rate, uniform deposition and formation of thin films, such as refractory metals and/or oxides, nitrides, hydrides, carbides and other compounds, mixtures, solutions and alloys of such metals, and also to the deposition and formation of composite films. Such films are formed on planar and non-planar, concave and convex substrates with a controlled thickness profile.

As used here, the term "controlled thickness profile" refers to tailoring the thickness profile of a thin film formed on a curved substrate from center to edge to achieve a desired optical performance. The term includes controlled varied thickness as well as constant thickness.

III. DESCRIPTION OF THE STATE OF THE CONVENTIONAL TECHNOLOGY

It is highly desirable to deposit optical quality thin films on non-planar substrates such as cylindrical and concave reflectors. However, it is difficult to deposit thin films which are durable, of high quality and of uniform thickness on what we shall term "shaped" (i.e., non-planar, convex or concave) substrates. Specifically, coatings deposited at oblique incidence angles by conventional evaporation methods tend to be soft and poorly packed, resulting in low index of refraction and poor film durability.

Masking is sometimes used to limit deposition angles in such systems. See FIG. 16. Masking, however, requires complicated chamber tooling and limits the efficiency of such systems.

Thin films have been formed on a variety of hemispheric-shaped and/or parabolic-shaped substrates by gas scattering of thermally-evaporated materials. Examples of commercial applications of the technology include dental and surgical mirrors and the M-16 cold mirrors depicted in FIGS. 15A and 15B. However, coating materials such as $ZnS/MgF_2$, not metal oxides, are thought to be the materials of choice for the thermal evaporation gas scattering process. Metal oxides suffer from decreased film durability and decreased deposition rates when formed using this approach, as well as from reduced indices of refraction, which requires more layers.

IV. SUMMARY OF THE INVENTION

A. Objects of the Invention

In view of the above discussion of the limitations of the prior art, it is one primary object of the present invention to provide a process for depositing thin films of materials such as metal oxides and the other exemplary materials listed in Section II above, on shaped non-planar substrates, including concave and convex substrates, without the problems normally resulting from oblique incidence deposition and without using substrate masking, and with associated benefits such as durability and temperature stability.

It is another, related object to form highly durable, uniform, optical quality thin film coatings at high rates on non-planar substrates.

It is still another related object to form such coatings with a desired thickness uniformity or non-uniformity, to provide optimum optical performance.

B. Characteristics of Deposition and Reaction Zones

In one aspect, a fundamental difference between our invention and the prior art is that with our invention both deposition and reaction are effected in long narrow axial zones adjacent the periphery of a moving substrate carrier. According to this aspect, our reaction is effected by a means of highly intense plasma in a highly efficient manner at high reactive gas pressures in a long narrow zone, isolated physically from the metal deposition zone by a region of relatively low pressure. Through the use of a reactive ion source configured to produce an elongated uniform high intensity ion flux adjacent the periphery of the carrier for generating an intense reactive plasma from oxygen or other reactive gas, such as the linear magnetron, or suitably configured ion gun, the high pressure reactive volume is substantially comprised of highly energetic gas species, which greatly shortens the time required for the reaction. Another advantage of this technique, thus, is that the technique is not limited to reactive gases such as oxygen. Rather, compounds can be formed using less reactive gas species such as nitrogen, hydrogen, gaseous oxides of carbon, etc., to form nitrides, hydrides, carbides, etc. The invention overcomes all of the above-mentioned disadvantages of the prior art and affords further advantages in that considerable deposition speed increases can be realized through the use of multiple stations. The available reactive gas pressures and deposition rates are well above the practically attainable deposition rates using prior art equipment. Curved substrates can also be coated due to the elimination of the requirement for tight baffling.

In this application, we provide examples of applications which highlight the practical value of the fundamental differences between our invention and the prior art.

C. Present System and Operation

In a presently preferred approach for forming thin film coatings including refractory metal coatings and optical quality dielectric coatings such as metal oxide coatings, our invention uses a cylindrical processing configuration in which substrates are mounted on a rotating cylindrical drum carrier, or on a rotating planetary gear carrier. The substrates are moved past a set of processing stations comprising (1) at least one sputtering device (e.g., a planar magnetron or a CMAG rotating magnetron) operating in a metal deposition mode for depositing silicon, tantalum, etc., alternated with (2) preferably at least one of a similar device such as a planar magnetron operating in a reactive plasma mode, or an ion gun or other ion source configured to produce an elongated uniform high intensity ion flux adjacent the periphery of the carrier, for generating an intense reactive plasma, using oxygen or other reactive gases including but not limited to nitrogen, hydrogen or gaseous oxides of carbon. The arrangement provides zones for both deposition and reaction with complete physical separation of the zone boundaries. When similar magnetron cathodes are used, one is operated using a relatively low partial pressure of the reactive gas (such as oxygen) to provide the metal deposition mode while the other is operated at a relatively higher reactive gas partial pressure to generate the intense reactive plasma for oxidation, etc.

The substrates and cathodes may be located inside or outside (or both) the drum. Also, the arrangement is scalable in that a multiple number of cathodes/ion guns can be used in each processing station set to increase the deposition rates and the number of materials formed. Various processing station arrangements can be provided in a chamber and operated separately, sequentially or simultaneously for depositing and, e.g., oxidizing different metals. As one example, four stations can be selectively arranged and operated to perform the sequence tantalum deposition, oxidation, silicon deposition and oxidation, to quickly form alternating layers of $Ta_2O_5$ and $SiO_2$.

In our process, the relationship between the power of the deposition cathodes and the speed of rotation or translation of the substrate can be tailored so that in each pass, a deposited thickness of one or more atomic-layers can be obtained. By adding additional cathodes of other materials, and by adjusting the power to each cathode, effectively alloys can be created of any desired ratio. For example, NiCr can be formed in any desired ratio from cathodes of Ni and Cr, over large areas, simply by adjusting the relative power to the cathodes. By adding oxidation stations, one can form complex oxides such as barium copper yttrium oxide, forms of which are known to be superconducting.

D. Summation of Certain Practical Advantages of the Present System

The cylindrical rotating geometry used in our sputtering system combined with the sputter deposition stations and reactive plasma stations provide fast, uniform deposition of optical quality coatings on large volumes of both flat and curved parts. Parts such as tubes or polygons can be coated uniformly around the entire periphery thereof by incorporating a double rotating, planetary gear mounting arrangement. Additionally, we have deposited uniform coatings onto complex shapes such as lamp glass envelopes. The efficiency of the metal mode deposition in providing high deposition rates for a given power input coupled with the spreading of the deposit and heat over a large number of substrates/large drum surface area provides a unique combination of high deposition rates and low substrate heating which permits the high rate formation of coatings on even plastics and other low melting temperature materials.

To provide a basis for comparison, conventional DC reactive oxide sputtering processes provide oxidation rates $\leq 10$ Angstroms/second off the target, while our process provides instantaneous formation rates of about 100–150 Angstroms/second for $Ta_2O_5$ and about 100 Angstroms/second for $SiO_2$.

In one specific aspect, our invention eliminates a major difficulty associated with the prior art vacuum deposition of multilayer and single layer thin films on spherical, curved and non-uniform, unconventional shaped substrates, by using controlled process parameters to reproducibly form on such substrates durable, high-quality coatings having controlled thickness profiles of selected uniform or variable thickness. Previously, various techniques have been used in attempts to overcome the difficulties in achieving controlled deposition on curved and flat surfaces.

For example, previously, attempts have been made to solve uniformity problems using either double or triple rotation of the substrate coupled with introducing an inert gas to "scatter" the cloud of depositing material. Masking techniques have been used which shadow high vapor incidence regions in an attempt to match the vapor incidence rate there to low rate regions. Also, durability problems associated with the oblique incidence deposition on curved surfaces have been eliminated by masking such regions.

However, these scattering and masking strategies have significant difficulties. As mentioned above, scattering is used primarily for materials such as $ZnS/MgF_2$, which produce soft coatings with poor abrasion and temperature durability. Hard coating materials such as metal oxides, when thermalized, suffer from reduced indices of refraction and poor film durability when made using the gas scattering evaporation process. Masking increases coating chamber tooling complexity, especially for curved surfaces and complex curved surfaces such as bulbs, and reduces deposition rates.

As suggested above, our invention overcomes these problems by using a simple axial rotary motion coupled with our high rate reactive sputtering scheme. Axial rotation produces uniformity along the equatorial axis and the inherent high pressures associated with sputtering provides a gas scattering effect for polar uniformity. The higher energies of the sputtered atoms are sufficient to overcome the thermalizing effects of the gas scattering and, consequently, form films of materials such as metal oxide exhibiting good durability. High rates are achieved by using the unique reactive sputtering scheme described above in which the substrates such as (but not limited to) bulbs are rotated alternately through a high rate metallic sputtering zone and an energetic reactive plasma. This combination of rotating cylindrical geometry, and sputter deposition and reaction technology (presently, planar magnetron and reactive plasma technology) accomplishes the desired result: providing reproducible, highly durable, optical thin film coatings deposited at high rates and with controlled uniformity on a large surface area and/or a large number of flat or spherical or other curved substrates, including unconventional substrates formed to a complex curvature and/or formed of low melting point materials.

It is emphasized that, as used here in reference to the present invention, phrases such as "controlled thickness profile" or "controlled uniformity" imply not only the ability to deposit coatings of precisely constant thickness on flat or curved surfaces, but also the ability to vary in a controlled fashion the thickness of a coating deposited along a curved surface, to achieve desired design objectives such as spectral performance. Because it is an inherent property of optical thin films to shift to shorter wavelengths at higher incidence angles and because a variety of incident angles exist across the surface of a shaped substrate, the coating must be tailored in such a way as to balance the spectral performance across the reflector surface. For example, in the case of the MR-16 reflection depicted schematically in FIGS. 15A and 15B, the incident angles at the center of the reflector are approximately 10° while those at the edge of the reflector can be as large as 53°. A uniform thin film will shift optical thickness approximately 5% to shorter wavelengths (relative to incidence at 10°). Using our process, we are able to deliberately grade the thickness uniformity across the MR-16 reflector, and to provide a coating thickness which is about five percent thicker at the edge than at the center, to balance the spectral performance and make the light projection uniform.

V. BRIEF DESCRIPTION OF THE DRAWINGS

The above and other aspects of the invention are described with respect to the drawings in which:

FIGS. 1 and 2 are, respectively, a simplified schematic perspective view and a simplified schematic horizontal sectional view, both of a single-rotational cylindrical drum magnetron-enhanced vacuum sputtering system which embodies the principles of our present invention;

FIGS. 4 and 5 are, respectively, a simplified schematic perspective view, partially cut away, and a simplified schematic horizontal cross-sectional view of one type of DC linear magnetron sputtering device useful in the magnetron-enhanced vacuum sputtering system of the present invention;

Figure 3:
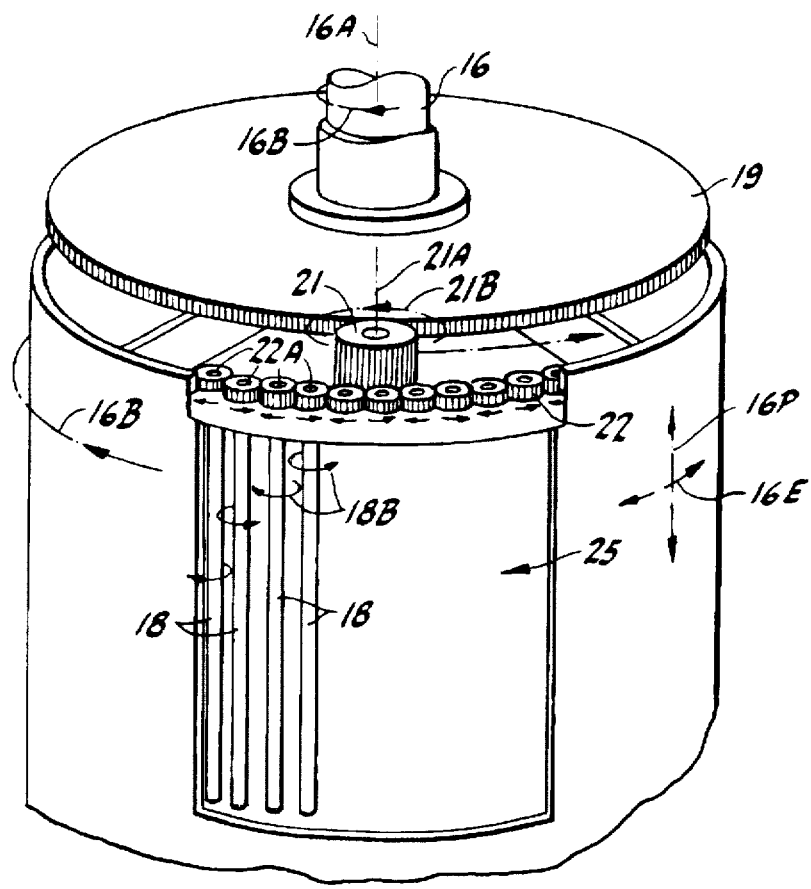
FIG. 3 is a simplified schematic perspective view of a double-rotational, cylindrical drum embodiment of a magnetron-enhanced vacuum sputtering system which embodies the principles of the present invention.
Figures 16, 17:
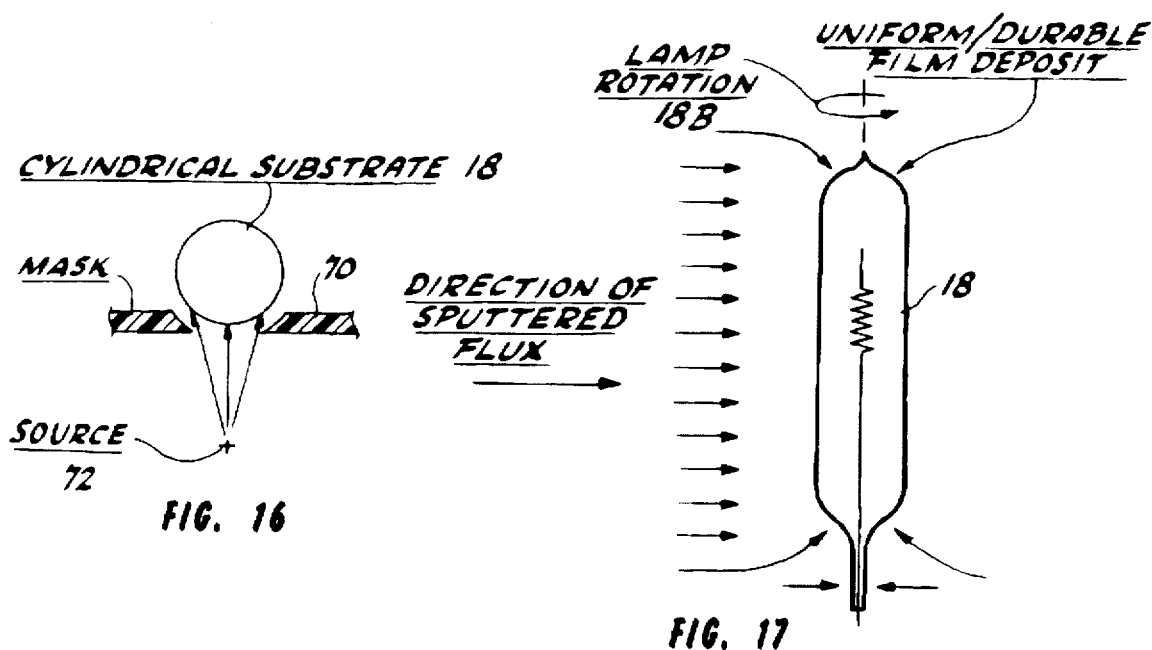
Figures 18A, 18B:
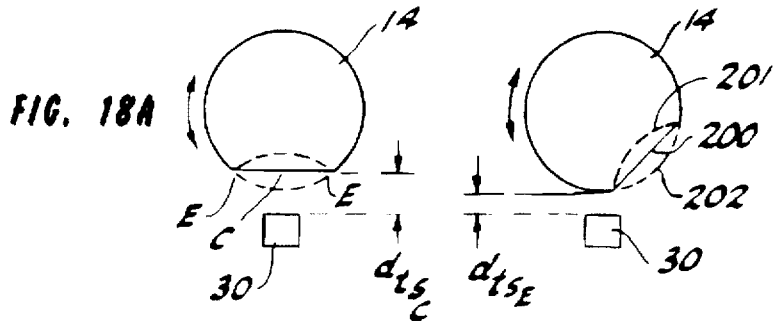
Figure 19:
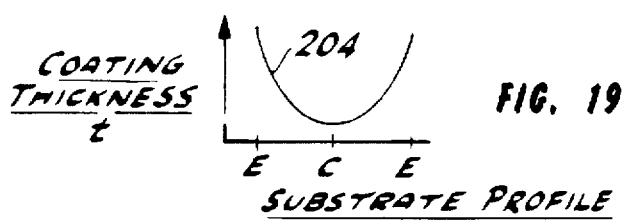
Figure 20:
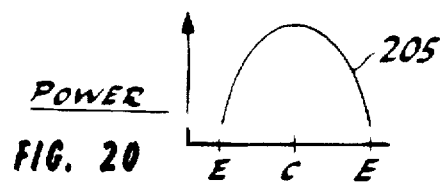
Figure 21:
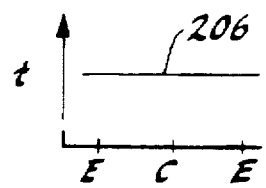
Figures 22A, 22B:
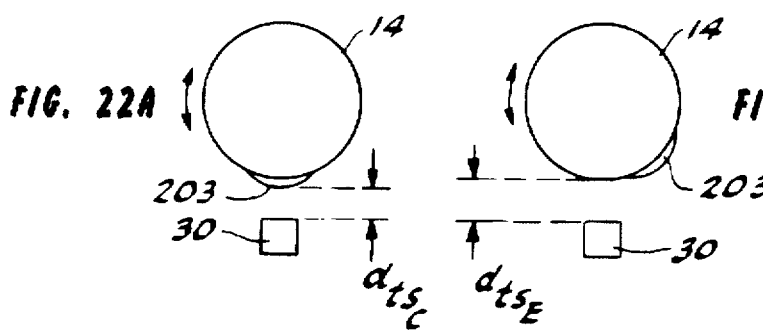
Figure 23:
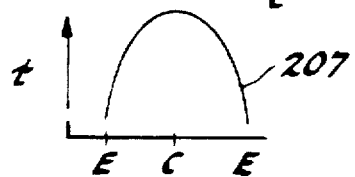
Figure 24:
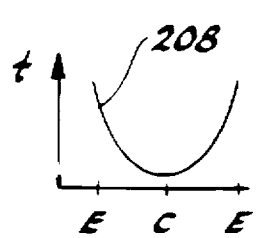
Figure 25:
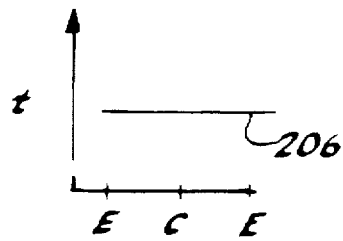

FIG. 16 schematically depicts the prior art Martin/Rancourt technique for masking convex substrates to preclude oblique incidence deposition;

FIG. 17 schematically depicts the process of depositing a thin film on a cylindrical glass bulb using the double rotational scheme of FIG. 3;

FIGS. 18A and 18B schematically depict target to substrate distances for, respectively, the center and edge of a planar, concave, or shallow convex substrate;

FIG. 19 depicts a thickness profile associated with the concave substrate of FIGS. 18A and 18B;

FIG. 20 depicts a graph of target power as a function of substrate position which is used to effect the uniform thickness profile depicted in FIG. 21, or other selected thickness profiles for planar, concave, or shallow convex substrates;

FIGS. 22A and 22B schematically depict target to substrate distances for, respectively, the center and edge of a convex substrate;

FIG. 23 schematically depicts a thickness profile associated with the convex substrate of FIGS. 22A and 22B; and FIG. 24 depicts a graph of target power as a function of substrate position which is used to effect the uniform thickness profile of FIG. 25, or other selected thickness profiles for convex substrates.

VI. DESCRIPTION OF THE PREFERRED EMBODIMENT(S)

A. Single and Double Rotation, Rotary System

In one aspect, our present invention combines linear DC magnetron sputtering cathodes operating in a partial pressure separation regime and rotary cylindrical workpiece transport to provide a sputter deposition system which is capable of high rate formation of single or multi-layer optical films of materials such as, but not limited to, $SiO_2$, $TiO_2$ and $Ta_2O_5$. This combination is achieved despite the previous incompatibility of linear magnetron sputterers and rotary workpiece transport and despite the inherent difficulty (as evidenced in the prior art) in implementing partial pressure separation.

Figure 1:
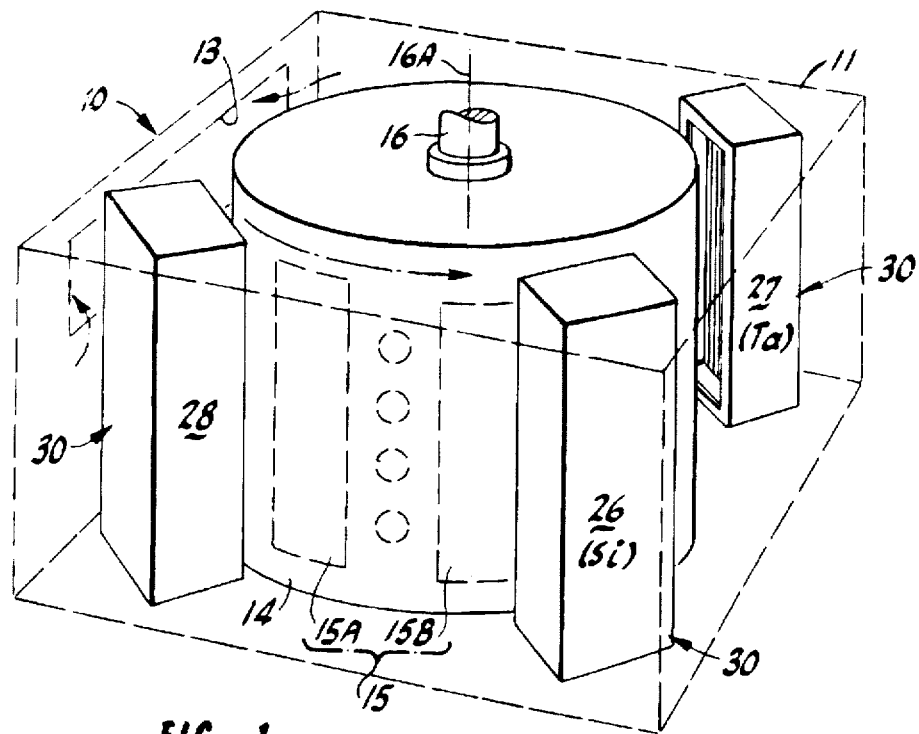

FIGS. 1 and 2, respectively, depict a simplified schematic perspective view and a horizontal sectional view of a single rotation embodiment of our magnetron-enhanced vacuum sputtering system. The illustrated sputtering system 10 comprises a housing 11 which forms a vacuum processing chamber and is connected to a suitable vacuum pumping system 12 shown in FIG. 2. The vacuum pumping system includes a cryopump or other suitable vacuum pump or combinations thereof for exhausting and pumping down the vacuum chamber via exhaust port 13. The system 10 also includes a cage-like drum 14 which is mounted for rotation about shaft 16 and has a cylindrical side which is adapted for mounting substrates 15 of various configurations and sizes. The substrates 15 can be mounted directly on the drum 14, facing outwardly toward sputtering stations which are spaced about the external periphery of the drum or facing inwardly toward sputtering stations spaced along the internal periphery of the drum.

Alternatively, and referring to FIG. 3, the system 10 may incorporate one or more double rotational motion mounting arrangements 25, either in conjunction with or as a replacement for the drum 14. The illustrated planetary gear arrangements can be provided on the drum alone or in combination with the single rotation substrate mounting positions 15. The planetary gear arrangement mounts and imparts double rotational motion to articles such as tubes 18. The planetary gear system 25 may comprise a sun gear 19 which is driven by shaft 16. Alone or in conjunction with a ring gear (not shown), the sun gear 19 rotates the associated planet gears 21 about their own rotational axes 21A as well as about the sun gear's rotational axis 16A. In the illustrated embodiment, the planet gear 21 is operatively connected to a train of gears 22 which are mounted on shafts for rotation about their axes 22A. The tubes 18 are mounted on and rotate with the planet gear support shafts about axes 22A. As a consequence of this planetary gear mounting arrangement, rotation of drum 14 and sun gear 19 along reversible path 16B about axis 16A rotates planet gears 21 along path 21B about axis 21A, which is converted by the gear train into alternating rotation of tubes 18 along paths 18B about axes 22A. This double rotary motion of the sun gear 19 and the planetary gears 21 enhances the ability to coat articles such as tubes uniformly about their entire circumference.

Referring further to FIGS. 1–3, in the illustrated embodiment, a plurality of magnetron-enhanced sputtering devices, designated generally by the reference numeral 30, are positioned about the outer periphery of the drum 14. In one exemplary embodiment, the station designated 26 is used to deposit material such as silicon whereas station 27 deposits a different material such as tantalum and station 28 is used to react a gas such as oxygen with the substrates to convert the deposited metal layer(s) to oxide. Thus, by rotating the drum 14 and selectively operating the sputtering and reaction stations 26, 27 and 28, the metals and/or oxides thereof can be selectively formed on the substrate in essentially any desired combination. For example, by rotating drum 14 and sequentially activating the cathodes sequence 26 and 27, while continuously operating cathode 28, system 10 can form a silicon layer a few atoms thick and oxidize the silicon to sio then deposit a layer of tantalum a few atoms thick and oxidize the tantalum to $Ta_2O_5$. This sequence can be repeated and altered as required to form a composite optical coating of layers of $SiO_2$ and $Ta_2O_5$ of precisely controlled thicknesses. It should be noted that oxidation stations 30 such as the one at station location 28 can use a planar magnetron cathode similar to deposition stations 26 and 27, by substituting oxygen for the argon; or can use other ion sources capable of generating a reactive ionized plasma, such as ion guns or the linear magnetron ion source described in FIGS. 6 and 7, or other devices which generate the required reactive DC or RF plasma.

B. DC Magnetron Sputter (and Reaction) Devices

FIGS. 4 and 5 schematically illustrate one type of DC magnetron sputtering device 30 which is commercially available from VacTec or other suppliers and can be used at station locations 26 and 27 and, optionally, at station 28, FIGS. 1 and 2. The sputtering device 30 comprises a housing which mounts a cathode 31 and forms a front, reactive gas baffle 32 having an opening 36 which is selectively closed by a shutter (not shown). Cathode 31 is connected to a power supply 33 for applying a voltage of, e.g. −400 v. to −600 v. to the cathode relative to the baffle 32, which is at anode potential (usually ground). Permanent magnets (not shown) are mounted within the cathode body for supplying a magnetic field B of rectangular racetrack configuration along the surface of the target 34 and perpendicular to the applied electric field. Manifold tubes 37 are situated adjacent the target 34 and are connected to a source of gas for supplying reactive gas such as oxygen or an inert working gas such as argon to the sputter chamber defined by baffle 32 and target 34. The device is cooled by water which is supplied via inlet 38 and circulated to an outlet (not shown). The baffles 32 in the individual sputter devices 30 effectively divide the overall processing chamber 10, FIGS. 1 and 2, into different regions or sub-chambers at each sputterer in which different gas atmospheres and/or gas partial pressures can be established. Improvements could be readily implemented where one or more additional pumps could be placed to improve separation between regions of reactive and non-reactive gases.

Figure 6:
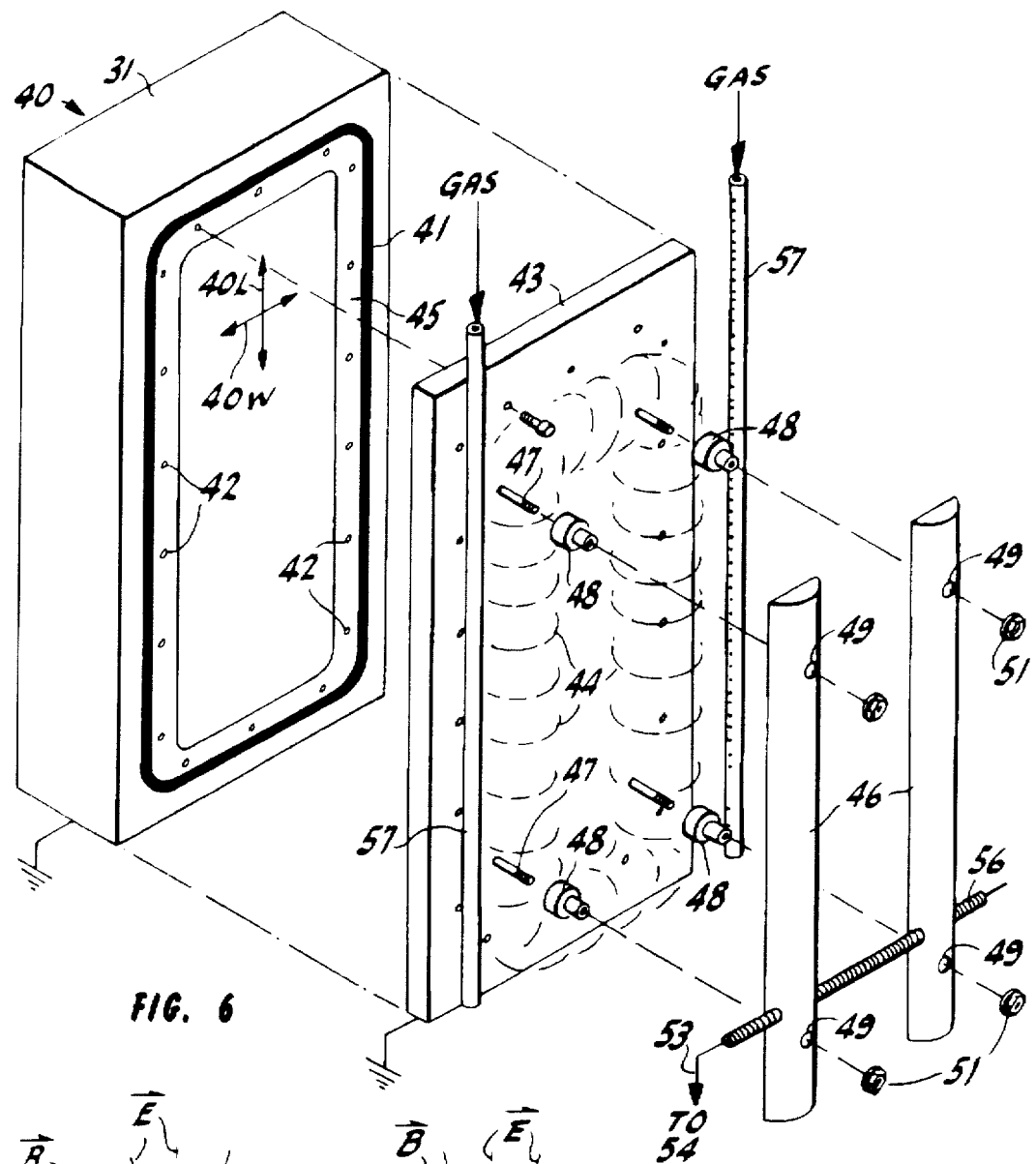
FIGS. 6 and 7 are, respectively, an exploded perspective view and an end view, partly in schematic, of one embodiment of a linear magnetron ion source useful in the magnetron-enhanced vacuum sputtering system of the present invention.
Figure 7:
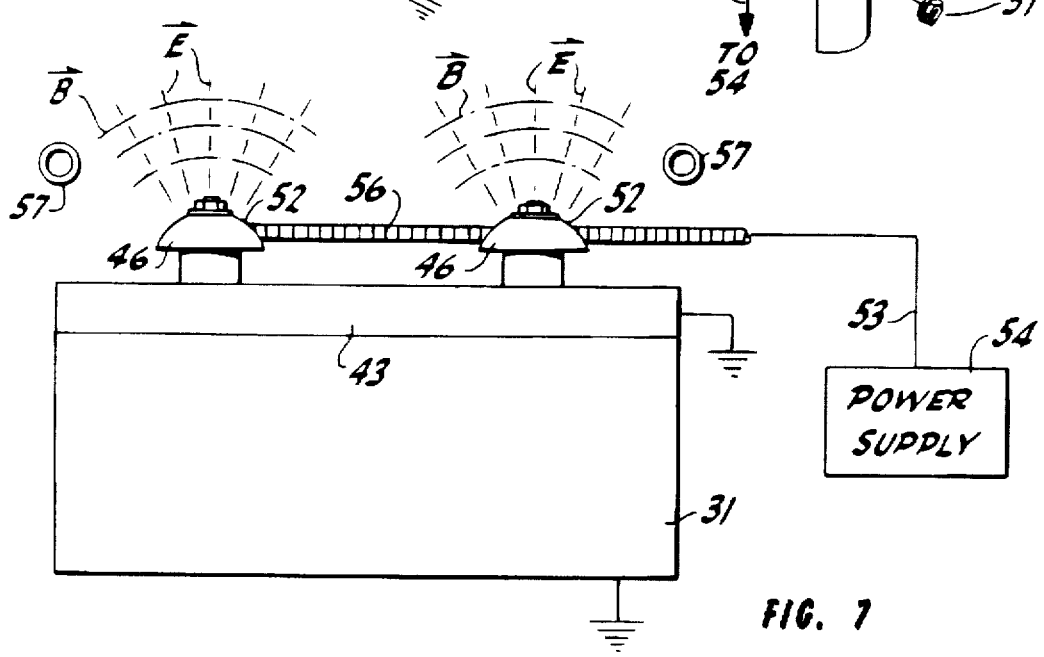

Compounds, etc., such as oxide dielectric films can be formed using the linear magnetron sputter devices 30 at the sputter stations 26 and/or 27 and using a different type of device, such as the ion source 40, FIGS. 6 and 7, which is described in the next section, at reaction station(s) 28. Alternatively, one can use at least two baffled linear magnetron sputter devices 30 at the sputter stations 26 and/or 27 and at the reaction station 28. In both cases, the sputter device and the ion source device are enclosed in distinct partial pressure regimes or chamber regions between which the substrate is alternated by the continuously rotating drum. When baffled magnetron cathodes 30 are used both to sputter and to oxidize, the cathodes are operated at relatively high power density in an oxygen ambient within chamber 10 using a target designed for sputtering the selected metal such as silicon or tantalum. However, the baffle-separated magnetron cathodes which are used at stations 26 and 27 for metal deposition are operated in a low reactive gas (oxygen) partial pressure environment for operating in a metal mode and depositing metal at consequentially high rates. The low oxygen partial pressure is supplied by flowing inert working gas such as argon into the chamber area via manifolds 37. The other type of baffled magnetron cathode 28 is operated at relatively higher reactive gas partial pressure and sputter deposits the metal at a much lower rate on the moving substrates but oxidizes the metal at a much higher rate. The lower rate target adds little to the overall deposition rate and thus does not affect control, but does produce a highly reactive plasma which allows the chamber oxygen to readily react with the growing thin film and, as a result, permits the use of a relatively low overall chamber oxygen partial pressure, which enhances cathode stability and rate. This reactive sputtering approach provides repeatable thin films deposited at high rates, fully oxidized and with good optical qualities.

C. Linear Magnetron Ion Source

FIGS. 6 and 7 depict a presently preferred embodiment of a linear magnetron ion source 40 which can be used at reaction station(s) 28, FIGS. 1 and 2 to provide the desired narrow elongated reaction zone. The linear magnetron ion source 40 uses electrons associated with the sputtering plasma to generate ions from a reactive gas in a separate local plasma. These ions bombard the sputter-deposited material on the substrates and thus form compounds with the sputtered material. The ion source 40 can use the cathode assembly 31 and the housing 32 shown in FIGS. 4 and 5 (for clarity, housing 32 is deleted in FIGS. 6 and 7). As adapted for use as a linear magnetron ion source, direct-cooled cathode 31 includes an O-ring seal 41 and tapped holes 42 in the face to insulatingly mount a non-magnetic stainless steel cover plate 43 in place of target 34 to seal water circulation channel 45 in the cathode body. As mentioned previously, cathode 31 also incorporates permanent magnets (not shown) which provide a magnetic field B of elongated rectangular "race track" configuration 44 along plate 43 when the plate is assembled to the cathode.

The ion source 40 is mounted adjacent the periphery of the rotatable substrate carrier 14 with its long direction or axis 40L parallel to axis 16A of the carrier 14, FIG. 1, and the width or short axis 40W parallel to the circumference and the direction of rotation 16B, FIG. 3, of the carrier.

A pair of stainless steel bar anodes 46–46 are mounted along the elongated opposite sides of the magnetron race track 44 on posts 47 which themselves are mounted to the non-magnetic plate. The anodes 46 are insulated from the posts 47 and plate 43 by stepped insulator stand-offs 48 having relatively small sections which extend into holes 49 in the bar anodes 46 and larger bottom sections which serve to precisely space the anodes from the stainless steel plate 43, as shown in FIG. 7. For mounting, the posts 47 are inserted through the stand-offs 48 and through the holes 49 in the bar anodes 46, and are secured by nuts 51.

Each anode 46 is a straight bar which is slightly shorter than the long side of the magnetron race track 44. Each anode's curved, generally cylindrical outer-facing surface 52 conforms closely to the shape of the magnetic field lines, B, FIG. 7. The anodes 46 are connected through wire leads 53 to a conventional power supply 54 capable of providing several amps current at, for example, +50 volts to +140 volts bias. Preferably, insulating beads 56 (or other suitable insulation) are mounted along the section of the leads 53 within the housing to isolate the leads from the plasma and prevent discharge at the wire. Typical operation is at 2 to 4 amps and 100 to 120 volts for a nominally twenty inch long magnetron cathode.

As mentioned, the mounting location or station of the linear magnetron ion source 40 is outside the sputtering region(s) 26 or 27 but within the associated plasma, which extends essentially throughout the vacuum sputtering chamber. In operation, the power supply 54 is used to maintain the stainless steel bar anodes 46 at a positive DC voltage of, for example, 100 to 120 volts relative to the cathode 31 and the stainless steel plate 43, which are at system ground and at an even greater positive potential with respect to electrons in the surrounding plasma. As shown most clearly in FIG. 7, the curved surfaces 52 of the anodes provide electric field lines E which are substantially perpendicular to the magnetic field lines B. Electrons in the associated plasma are accelerated towards the positive anodes 46 and are trapped or confined by the resultant E×B field along the magnetron race track, greatly enhancing the probability of collisions with the reactant gas supplied via adjacent inlet manifolds 57, and thereby generating an intense plasma defined by the race track configuration 44. That intense plasma generates many ions from the reactant gas which are accelerated away from the anodes 46 by the potential gradient existing between the anodes and the background plasma and toward the substrates to enhance the reaction process, e.g., to enhance oxidation of sputtered metals using oxygen as the reactant gas.

In short, during operation, the elongated inverse linear magnetron ion source 40 provides an intense long narrow reaction zone defined by the magnetron race track 44 having the long dimension thereof spanning substantially the height of the substrate carrier drum 14 and the narrow dimension thereof defined along the circumference of the carrier parallel to the direction of rotation. In distinct contrast to the prior art's requirement that substantially the entire volume outside the single sputtering zone be used for oxidation, in the current version, our ion source 40 has a reaction zone which is only about approximately five to six inches wide and occupies a small fraction of the circumference of the 29 inch diameter drum 14 (5"/πD=5"/91"=5.5%), yet due to the intense magnetic field-enhanced plasma reaction, completely oxidizes the deposited thin film in, typically, a single pass. The small ion source cathode size and the fast reaction rate provide unique upward scaling capability, enabling the use of a multiple number of sputtering cathodes and oxidation reaction cathodes to provide high rate, high volume, high throughput deposition and versatility in the selection of the composition of the deposited coatings.

The combination of the rotatable drum and baffled magnetron-enhanced sputtering and reaction cathodes has provided high rate, precisely controllable optical quality metal and dielectric layers in thicknesses which are scalable, on both flat, curved and irregularly shaped substrates with a minimum of masking. Also, because a given layer is built up by a multiplicity of coating passes, the effects of cathode arcs are greatly decreased since any such arc represents only a portion of the coating. Additionally, when operating in the metal mode, magnetron arcs are typically less frequent and intense.

The process described above involves sputtering metal materials such as, but not limited to, silicon, tantalum, titanium, iron or any other sputterable material that forms stable oxides in an atmosphere that permits the target to operate in the metal mode, characterized by the highest rate of sputtering, while elsewhere in the machine establishing an ion process which preferably uses magnetron-enhanced sputtering to expose the freshly deposited film to a reactive atmosphere that converts it to an oxide. The metal preferably is deposited no more than a few atoms thick in order that the oxidation during the subsequent reaction process is complete. Typically, the drum 14 is rotated through the spatially sequenced sputtering and reaction zones and the process of sputter deposition, oxidation, sputter deposition, oxidation is repeated as required to build up the oxide layer to the desired thickness of material such as $SiO_2$. Then if a different layer such as $Ta_2O_5$ is to be formed the same repetitive process is repeated. Quite obviously, various oxide forming cycles and metal deposition cycles can be applied as required to form composites of oxides alone, oxides and metals, or metal(s) alone.

As mentioned above, a locally intense ionized reactive plasma from an ion source such as an ion gun or a planar magnetron is used to provide the oxidizing reaction. The uniformity of the magnetron sputter-deposited metal films is precise, and the cylindrical geometry allows uniform distribution of sputtering materials. Thus, it is possible to use time and power control of the process in almost any width or length of cathode, thereby overcoming the historical problems of controllability, scalability and throughput associated with conventional DC magnetron reactive processes. As demonstrated in the examples below, this ability permits precision deposition of fractional optical layers such as one-sixteenth visible wavelength optical layers which are difficult to deposit using conventional vacuum evaporation processes.

D. Alternative Rotary Cylindrical Systems

Figure 8:
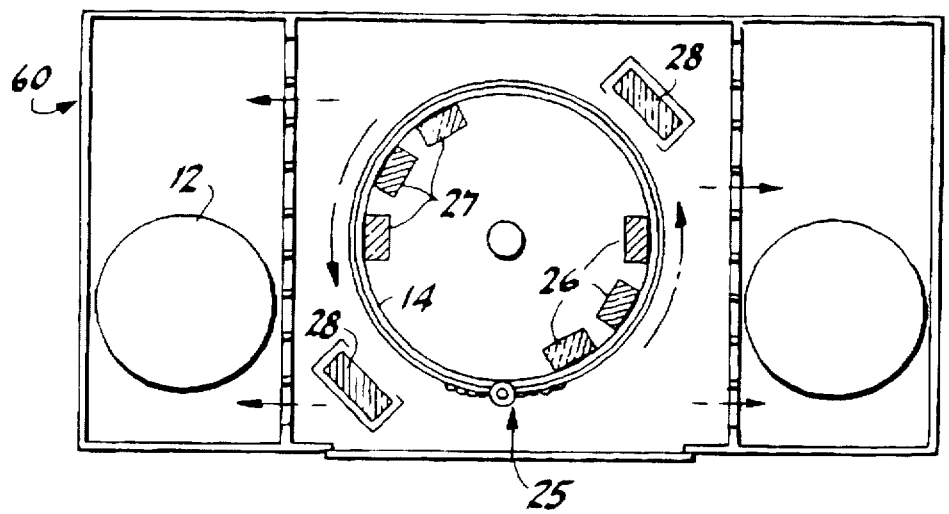
FIG. 8 is a simplified schematic horizontal sectional view of an alternative rotational cylindrical drum embodiment of our system.

FIG. 8 depicts an alternative sputtering system 60 which comprises a pair of cryopumps 12—12 situated on opposite sides of the vacuum sputtering chamber, a plurality of silicon sputtering devices 26 and tantalum sputtering cathodes 27 formed on the inside of the drum 14 facing outwardly and interspersed oxidizing devices 28 situated on the outside of the rotating drum 14 facing inwardly. The illustrated system incorporates a planetary gear substrate mounting and drive arrangement 25 for uniformly exposing the periphery of work pieces such as tubes to both the internal and external sputtering stations. By virtue of this arrangement, and the multiple silicon, tantalum and oxygen cathodes, the silicon and tantalum layers and the oxidation of said layers can be done at a high rate on a large number of substrates. For example, a composite layer comprising $SiO_2$ and $Ta_2O_5$ can be formed by operating the silicon cathodes 26 simultaneously with the upper right oxygen cathode 28, followed by operating all of the tantalum cathodes 27 simultaneously with the lower left oxygen cathode 28.

In still another application, the drum used in the previously described cylindrical sputtering system can incorporate tooling that flips or rotates substrates during a run to extend the capacity of the coating machine. The possibilities include the use of parallel banks or faces of substrates which are rotated 180° to present substrates in each bank to the sputtering stations or separate drums or multiple-sided support bodies which are, for example, of triangular or other polygonal cross-section and are rotated by a planetary gear arrangement to present the faces or the entire circumference to selected sputtering stations. Also, the supports can be mounted about an axis parallel to the drum axis for rotation under computer control to selectively present substrates to the work stations.

E. Controlled Coating Thickness Profiles On Planar and Non-Planar Substrates As described above and evidenced in several of the following examples, our sputtering invention can provide a constant coating thickness along flat substrate surfaces and curved substrate surfaces, including both convex and concave topographies. Furthermore, the ability to precisely control the coating thickness encompasses the selective variation of coating thickness along both flat and curved substrate surfaces. As evidenced below our process forms durable optical quality oxide thin films and other thin films on highly curved substrates at high formation rates (currently at an instantaneous rate of 100–150 Angstroms/second at the target) and with optical properties (characterized, e.g., by reflectance and transmittance) closely similar to those obtained on a flat substrate.

1. Convex-Shaped Substrates

As mentioned in the Background of the Invention, when using prior art optical coating technology, it has been difficult to deposit on "shaped", convex substrates, such as cylinders, optical quality thin films which are durable, of high quality and of uniform thickness. Specifically, coatings deposited at oblique incidence angles by conventional evaporation methods tend to be soft and poorly packed and to have reduced optical properties.

As depicted schematically in FIG. 16, masking has been used to limit deposition angles in such systems. In the illustrated, exemplary prior art system, an axial mask 70 is positioned closely adjacent to a cylindrical substrate 18, between the source and the substrate, to limit deposition to low angles (typically 30° max.) and thus prevent the poor quality films provided by deposition at higher angles (30°<θ<90°). However, masking decreases deposition and throughput and requires complicated tooling.

Our invention permits thin film deposition on convex-shaped substrates, including cylinders, without the problems associated with oblique incidence deposition and without the need to use substrate masking and associated complex chamber tooling to eliminate such problems. More specifically, our process accomplishes the heretofore unattainable goal of forming highly durable, uniform, optical quality thin film coatings at high rates on cylindrical and other convex-shaped substrates.

Our process overcomes the problems of oblique incidence deposition by using the above-described simple axial rotary substrate motion and high rate reactive sputtering scheme (FIGS. 1–3). More specifically, our process accomplishes the heretofore unattainable goal of forming highly durable, uniform, optical quality thin film coatings at high rates on cylindrical substrates and other convex-shaped substrates without masking. The inherently high pressure of about 1–5 mT at target-to-substrate distances of about 5–20 cm associated with the sputtering process provides multiple collisions per particle, resulting in a high degree of gas scattering, which enables the necessary uniformity along the polar axis 16P, FIG. 3. At the same time, the high sputtered particle energies of about 10 eV which are inherent to our process reduce gas scattering somewhat and provide good durability while retaining the advantages of gas scattering.

Moreover, the combination of this reactive, omnidirectional sputtering process with the double rotary-motion sputtering scheme depicted in FIG. 3, enables uniform deposition 360° about the equatorial axis 16E. The use of an axially elongated sputtering deposition source such as (but not limited to) the linear magnetron sputter source, FIG. 5, adapts the sputtering scheme to elongated substrates such as the cylindrical glass tubes 18, FIG. 3.

The ability to uniformly coat substrates which are curved in three dimensions and to coat over 360° is illustrated schematically in FIG. 17 for cylindrical glass bulbs 18. Specifically, the use of the double-rotary motion sputtering scheme depicted in FIG. 3 in combination with the omnidirectional uniform deposition which is inherent to our high pressure, high energy reactive sputtering approach forms a coating over the entire bulb 18, including the curved ends.

Also, high deposition rates are achieved by the unique reactive sputtering scheme depicted in the above-discussed FIG. 3, in which substrates such as cylindrical glass bulbs 18 are alternated at a high rate of speed between (1) the high rate metallic sputter zone(s)26, 27 (FIG. 1), which form a coating a few monolayers thick—typically 2–5 Angstroms—on the substrate, and (2) the energetic reactive plasma zone(s) 28 (FIG. 1), which effects selected reactions such as oxidation, nitridation, etc., and has the capability to completely convert the thickness of the deposited film to an oxide, nitride, etc.

In short, our process overcomes the problems associated with oblique incidence vapor deposition using relatively simple tooling and without the use of masks, and forms highly durable, uniform, optical quality metal oxide and reacted metal compound thin films at high rates on convex substrates.

2. Concave-Shaped Substrates

Figures 15A, 15B:
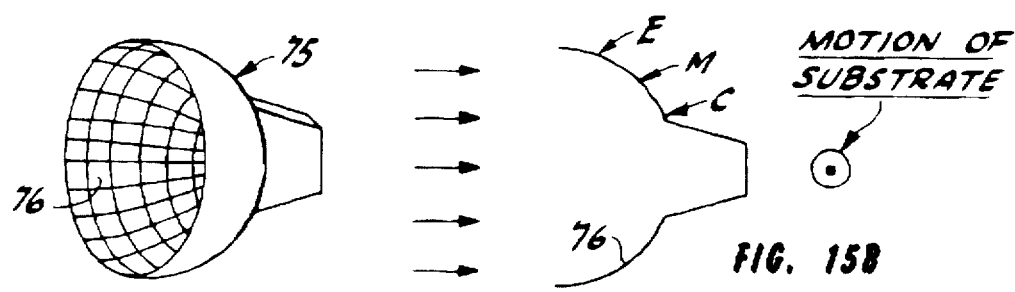
FIG. 15A and 15B are, respectively, a schematized perspective view and a vertical section view of a deep dish glass lamp reflector on which reflected multi-layer oxide coatings having the transmittance characteristics evidenced in FIG. 9 were formed using our present invention.

Our process also provides the ability to form thin film coatings of controlled thickness profile on shaped concave substrates including (but not limited to) parabolas and hemispheres such as the hemispherical MR-16 lamp reflectors, which are identified by the reference numeral 75 in FIGS. 15A and 15B. (Please note, we use the nomenclature of FIG. 15B in which the thicknesses at the center, middle and edge of the non-planar shaped interior substrate surface 76 of the reflector 75 are designated C, M, E, respectively.) As discussed at greater length below, our process provides control over the ratio E/C such that both controlled thickness uniformity (E/C=1) and controlled thickness non-uniformity (E/C not equal to 1) can be obtained.

Regarding controlled uniformity, historically thin films have been formed on a variety of hemispheric-shaped and/or parabolic-shaped substrates by gas scattering of thermally-evaporated materials. Examples of commercial applications of this technology include dental and surgical mirrors and the MR-16 cold reflector mirrors depicted in FIGS. 15A and 15B. However, as mentioned, the thermal evaporation gas scattering process typically is limited to $ZnS/MgF_2$ coating materials, because metal oxides are difficult to thermalize and suffer from reduced indices of refraction and poor film durability using this approach.

Our invention provides uniform formation of thin films of a number of metal and metal compounds such as metal oxides and reacted metal compounds on concave substrates without the problems of reduced indices of refraction and poor durability which are characteristic of the above prior art gas scattering approach. That is, uniform, durable optical quality thin film coatings are formed at high rates (without masking) on concave substrates.

Furthermore, as mentioned above, our process not only can provide controlled thickness uniformity across the film from center-to-edge but also can provide a controlled thickness non-uniformity from center-to-edge, hereafter also termed "desired non-uniformity". This desired non-uniformity is important because the degree of film thickness uniformity is dependent on the integrated incident spectral intensity at the point of interest on the substrate. Typically, the average angle of incident spectral intensity varies over the surface of the substrate, and because thin film properties shift as a function of the angle of incidence, making it desirable to have a specified film thickness variation or desired non-uniformity over the substrate surface. Substrates with the appropriate non-uniformity possess the desired spectral/color balance.

Stated somewhat differently, in most practical applications involving optical coatings on concave reflector substrates, if one is to achieve the desired spectral/color balance the film thickness must be precisely tailored over the radial (center to edge) direction to adjust the spectral response of the multi-layer device to the angle in which light from the bulb (filament) is incident on the mirror surface. The profile can be defined as the ratio of two wavelengths for a given spectral feature measured on the edge and on the center of the reflector. The ratio of these two wavelengths gives a figure of merit for the film profile called the E/C ratio.

We have determined that the desired thickness uniformity and non-uniformity of thin films formed on concave-shaped substrates such as hemispheres and parabolas and the ratio E/C can be achieved and controlled by manipulation of a number of parameters, major ones being the following:

1) Total process pressure, Ptot: E/C is an increasing function of $P_{tot}$;
2) Kinetic energy, $E_k$, of the sputtered particles: E/C is a decreasing function of $E_k$;
3) Mass, $m_s$, of the sputtered material: E/C is a decreasing function of $m_s$;
4) Mass, $m_g$, of the working gas: E/C is an increasing function of $m_g$;
5) Target to substrate distance, $d_{ts}$: E/C is an increasing function of $d_{ts}$;
6) Aspect ratio or sagittal depth of the substrate: E/C is a decreasing function of this ratio;
7) Target power: increasing power decreases E/C; and
8) Uniformity of working conditions.

From the above, increasing (1) system pressure, (4) the mass of the working gas, (5) the target-to-substrate distance, or (7) target power, increases E/C. Conversely, increasing (2) the kinetic energy of the sputtered particles, (3) the mass of the sputtered material, or (6) the aspect ratio of the substrate, decreases E/C.

We have demonstrated the ability of our process to achieve desired uniformity and non-uniformity on a number of M-16 substrates. Characterization of the thin films formed on the M-16 substrates has provided evidence of the above parameters. For example, with all other parameters fixed, Ta, having a mass of 181 AMU, yields a coating 15 percent thicker at the edge than at the center of the reflector. Ti, having a mass of 48 AMU, yields coatings that are 10 percent thicker at the edge of the reflector. Si, having a mass of 28 AMU, yields coatings that are 20 percent thicker at the edge of the reflector. Also, by reducing the total system pressure the relative thickness of titanium thin films at the edge of the reflector is reduced compared to the center of the reflector. Presently, for MR-16 reflectors, we have achieved controlled variation of E/C ratio over the range $0.76 \leq E/C \leq 1.20$.

The ratio E/C has been used to study the influence of key variables on the film thickness profile and to optimize the profile across the surface of the substrate. That is, we have studied the combined effect of process parameters on the ratio E/C using a statistical optimization program, XSTAT. This program was used to arrive at a prediction equation for a given film characteristic in terms of the sputter deposition parameters. E/C was included as one of the film characteristics. The resulting prediction equation is:

E/C = (0.6554) TD + (0.25) IGC − (0.91) PWR + (0.006) OXY − (0.008) AR − 5.4, where
TD = target distance
IGC = ion gun current -continued PWR = target power
OXY = oxygen flow, and
AR = argon flow.

Using our sputtering process and the single rotation system depicted, for example, in FIGS. 1–3, all of the above parameters can be controlled with an extremely high degree of uniformity, allowing thickness profiles to be predicted and tailored to a degree that would be lost in the random variations and inherent non-uniformities of the prior art processes. Example 1 below demonstrates this ability to provide a controlled varying thickness profile on concave substrates, while Examples 2–6 demonstrate the ability to form uniform constant thickness coatings on flat and other curved substrates. Regarding Example 1, a typical value for this profile or E/C ratio for concave reflectors, FIGS. 15A and 15B, is 1.05. This means that the film stack thickness must be gradually increased to provide an edge thickness which is five percent greater than the thickness at the center.

3. Target Power-Controlled Thickness Profile

In Section 2 above, we discussed the use of target power to control the thickness in the plane of rotation of thin film coatings formed on concave substrates. More generally, and as is discussed below, the approach is applicable to convex as well as to concave substrates.

Referring to FIGS. 18A and 18B, when a substrate 200, 201 or 202 which is planar, concave or shallowly convex (convex curvature less than the curvature of the associated rotating drum 14), respectively, traverses past the deposition source 30, the target-to-substrate distance is less at the edges than at the center. As a consequence, and referring to the graph 204 of coating thickness as a function of substrate position, FIG. 19, the coating thickness is greater at the edges of the substrate than at the center; i.e., E/C>1. Referring to FIG. 20, the target power 205 can be used to offset this inherent non-uniformity and to provide a uniform coating thickness 206, FIG. 21, by increasing the power input for the center relative to the edge as the drum and substrate rotate past the source 30. Alternatively, the power can be tailored to provide controlled non-uniformity.

As indicated in FIGS. 22A, 22B–25, the converse situation exists for convex substrates 203, i.e., those which possess curvature greater than that of the drum. Specifically, as shown in FIGS. 22A and 22B, for such convex substrates the target-to-substrate distance is greater at the edge than at the center of the substrates. The result, shown as curve 207, FIG. 23, is a decreased thickness at the edge relative to the center. To provide the desired uniformity profile 206, FIG. 25, the power is increased as the substrate edge traverses the target relative to the power level used during center traversal. See exemplary power curve 208, FIG. 24.

It should be noted that the problem of non-uniformity increases as the size of the substrate increases. Our controlled power variation allows us to uniquely tailor our process to large substrates. Power variations of only a few percent are required at a rate typically determined by the substrate size, drum circumference and rate of rotation. For example, 10 in. diameter flat substrates mounted on a drum of 100 in. circumference (30 in. diameter) rotating at 90 rpm require power variation capability of about 60–100 Hz. As a consequence, standard commercial power supplies such as those used for the magnetron target 30, FIG. 5, can be adapted as well for our power-controlled process by increasing the frequency response or by inserting an intermediate device. A controllable absorber can be installed between the power supply and the target.

In summary, our invention solves the problem of depositing metal oxide and other coating materials with the desired uniformity or non-uniformity on hemispherical—and/or parabolic-shaped substrates. To our knowledge, our process is the only one that has successfully deposited metal oxides onto curved substrates while retaining high temperature durability and the nominal refractive indices associated with metal oxide thin films formed on flat substrates.

F. Summary of Rotary System Operation

Prior to considering specific examples, it is helpful to review the sequential steps used in our presently preferred method of operating the rotary magnetron sputtering apparatus. Because the examples described below were obtained using the single and double rotational apparatus depicted in FIGS. 1–3, the description of the method of operation is keyed to this apparatus and to revised embodiments of this apparatus which use four (or more) metal sputtering and oxidation/reaction stations.

Initially, the reflectors or tubes or other substrates are mounted on the periphery of the drum. The vacuum enclosure/chamber is then pumped down to a background pressure of, for example, $1\times10^{-6}$ torr and rotation of the drum at the selected speed is initiated.

Next, the metal sputtering cathodes which are to be used during a selected coating sequence are started up by flowing the sputter gas, illustratively argon, through the inlet manifolds 37 and applying power to the cathodes 31 via associated power supplies 33. Prior to the initiation of the deposition/(deposition plus oxidation) coating cycle, the cathode shutters are kept closed to prevent deposition.

Once the operation of the sputter cathodes has been initiated, operation of the ion source or ion sources 40 is started. As mentioned, operation of ion source 40 utilizes the plasma associated with the operation of the sputter cathode (s) 30 and, thus, requires prior operation of the sputter cathode. Certain other ion sources, such as the sputter cathode 30 operating in an oxidizer mode, do not depend upon a separate plasma for operation but it is preferable not to start even these devices until operation of the sputter cathode has stabilized. Operation of the ion source(s) is initiated by applying the inlet flow of oxygen or other desired reactant gas or mixtures thereof via the inlet manifolds 57 and by applying power via power supply 54.

With the sputter cathodes and ion source cathodes established at stable operating conditions, that is, at stable selected power, gas flow and pressure and with the drum operating at the specified rotational speed to provide selected deposition and oxidation rates, the desired deposition and oxidation sequence is effected by selectively opening the shutters. For example, and assuming that four sputter and oxidation stations are positioned around the periphery of drum 14 in the sequence metal 1 cathode, ion source oxidizer, metal 2 cathode and ion source oxidizer, the following coatings can be attained by the associated shutter opening sequence:

1. Metal 1 deposition and oxidation; metal 2 deposition and oxidation→metal 2 oxide on metal 1 oxide (i.e., metal 1 sputter cathode shutter and the associated oxidizer shutter are open together, then the metal 2 sputter cathode shutter and associated oxidizer shutter are open together);
2. Metal 1; metal 2 and oxidation→metal 2 oxide on metal 1;
3. Metal 1 and oxidation; metal 2→metal 2 on metal 1 oxide;
4. Metal 2; metal 1 and oxidation→metal 1 oxide on metal 2;
5. Metal 2 and oxidation, metal 1→metal 1 on metal 2 oxide;
6. Metal 1 and metal 2 simultaneously (i.e., the shutters for the metal 1 cathode and the metal 2 cathode are opened simultaneously)→a layer which is a mixture of metal 1 and metal 2; and
7. Metal 1 and metal 2 and oxidation (metal 1, metal 2 and oxidizer shutters open together)→an oxidized mixture of metal 1 and metal 2.

Quite obviously, an essentially unlimited number of combinations of multi-layer coatings can be formed of various materials and using a multiplicity of cathodes.

Please note, during the formation of mixtures of two or more metals and/or other materials, preferably the sputter shutters are maintained open and the ratio of one material to another or to others is varied by adjusting the power, the pressure, the relative aperture size and/or the relative number of cathodes.

Also, in general, the thickness of a particular layer, either a compound or mixture or discrete material, is determined by the length of time the associated sputter cathode shutter (s) is open.

Based upon the above description and the following examples, those of usual skill in the art will be able to derive essentially an unlimited number of combinations of different compositions, compounds, alloys and mixtures of single and multi-layer metals and other materials and their oxides, nitrides, carbides, etc.

For example, the capability to form films of composite materials and alloys extends to films of continuously varying composition, and thus continuously varying optical properties, in a direction perpendicular to the substrate plane. The composition profiling can be accomplished by continually or periodically varying the power applied to one or more of the sputtering sources or by continually varying the aperture or shutter opening at one or more of the sputtering sources. Three important device categories are possible:

Transparent anti-reflecting coatings can be produced comprising a single film with a refractive index varying from the refractive index of the substrate material at the substrate to the lowest practical value at the outer interface. Such devices would typically be used to provide anti-reflection coatings effective over very broad bandwidths, generally two or more octaves wide.

Opaque anti-reflection coatings, typically used to provide general and selective absorbing surfaces on metal surfaces, can be produced by varying the film composition from 100 percent of some metallic component to 100 percent of some transparent material at the outer interface.

Transparent films can be formed having a continuous periodically varying profile. The refractive index profile could be a simple profile of a fixed frequency, or a more complex frequency-modulated profile. Typical uses of such structures would be as very narrow band reflectors having one or more discrete narrow reflection bands separated by regions of high transmission. A typical application of such devices would be for the protection of the eye or of an optical system sensor from laser radiation incident on that system in its wavelength region of transparency.

G. EXAMPLES

The following examples illustrate the ability of our process to deposit multi-layered, optical quality films in large quantities (high throughput) on different substrates, that is, substrates formed of different materials and including curved substrates. The films described in the following examples were all formed using the apparatus depicted in FIGS. 1–3 and, specifically, a drum 14 comprising the double rotational planetary gear arrangement 25 (for tubular or cylindrical substrates) and single rotational mounting positions 15 (for substrates such as sunglass lenses and lamp reflectors). The system used a 29 inch diameter drum rotated here at 48 rpm, a five-inch wide aperture in the isolation baffle, and a five-inch target width. The linear magnetron cathode 30 was used to sputter deposit various materials and the linear magnetron ion source 40 was used to oxidize the deposited materials.

The examples are characterized by the fact that the products described are required in large quantities, but with a high degree of consistency within any product type and the optical and mechanical properties of multi-layer systems which define the product function must be extremely uniform over the surface of the products.

With these products as examples, it is worth highlighting certain essential differences between our invention and the prior art discussed previously.

Using the sputter cathodes 30, our technique employs distinct separate non-contiguous zones for deposition and reaction. The overall pressure between the zones is low which minimizes arcing and subsequent loss of film thickness control.

The deposition and reaction zones at the periphery of the drum are long and narrow permitting the installation of multiple stations around the circumference of the cylindrical work surface. This is essential if more than one material must be deposited in the same process cycle, which is a requirement in all of the examples that we describe.

In addition to permitting an increased number of stations, the long narrow regular shape of the deposition and reaction zones permits the use of a large number of individual substrates and a large substrate area, with resultant high throughput, because a large number of reaction zones, as well as deposition zones can be positioned about the circumference of the rotating substrate carrier and because all substrates located around the work surface are exposed to the same material flux and plasma conditions. This ensures a very high degree of control of film thickness on the different substrates, which is essential for consistency within a product type.

The lack of a requirement for tight baffling between the deposition zone and substrate carrier permits the coating of substrates with curvature such that this tight baffling would not be practical. For example, it permits the coating of lenses and tubes.

1. Curved Glass "Cold" Mirrors (M16 & M13.25)

The system shown in FIGS. 1–3 was used in the single rotation mode to form reflective multi-layer oxide coatings comprising alternating layers of titanium dioxide and silicon dioxide on the concave inner surface 76 of glass lamp reflector substrates 75, FIG. 17, using the process of Table 1. See substrate position 15B, FIG. 1. Effectively, we coated the deep dish reflector surface 76 with two materials with precisely controlled uniformity at a high deposition rate. The coatings comprised twenty-one layers, $$\text{substrate} \left| \frac{(H/2\ L\ H/2)^5}{627\ nm} \quad \frac{(H/2\ L\ H/2)^5}{459\ nm} \right| \text{ambient},$$

where L=silicon dioxide and H=titanium dioxide, with the two stacks $(H/2\ L\ H/2)^5$ centered at QWOT (quarter wave optical thicknesses) of 627 nm and 459 nm, respectively. In the industry standard notation used above, each $(H/2\ L\ H/2)^5$ indicates a five-fold repetition of the layer sequence comprising, in order, a one-half QWOT layer of titanium oxide (H/2); a QWOT layer of silicon dioxide (L); and another one-half QWOT layer of titanium oxide (H/2).

Figure 9:
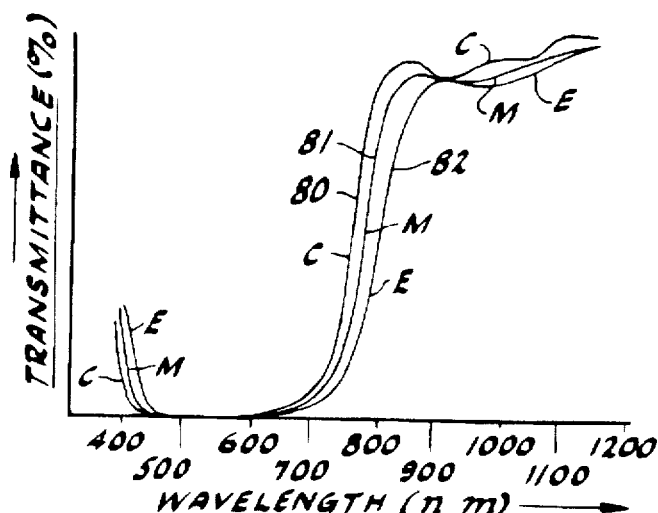
FIGS. 9–14 depict one or both the transmittance and reflectance curves for (a) optical quality films deposited on curved glass mirrors (FIG. 9), glass eyeglass lenses (FIG. 10), plastic eyeglass lenses (FIG. 11), and for (b) anti-reflective coatings on plastic (FIG. 12), yellow headlamp filter coatings (FIG. 13), and mirror coatings on infrared radiant heating lamps (FIG. 14)

Referring to FIG. 9, as demonstrated by curve 80, 81 and 82 for the percent transmittance curve as a function of wavelength at the film center, middle, and edge, respectively, the coatings possessed the desired E/C ratio of 1.05 and otherwise achieved the spectral performance design objective of transmitting infrared light energy, i.e., light of wavelength greater than approximately 700 nm, while reflecting visible energy without color alteration of the bulb light source.

TABLE 1

| | |
|---|---|
| Substrate: | Concave Glass |
| Rotary Motion: | Single |
| Material 1: | Titanium to form $TiO_2$ |
| Material 2: | Silicon to form $SiO_2$ |
| Cathode Rate, Material 1 (CR1): | 110 Angstroms/sec (A/s) |
| Cathode Rate, Material 2 (CR2): | 90 A/s |
| Material 1 Gas: | Argon 400 sccm |
| Material 2 Gas: | Argon 400 sccm |
| Material 1 Power: | 6 KW |
| Material 2 Power: | 5 KW |
| Argon Sputter Pressure: | 2.0 microns |
| Ion Source Operation for Material 1: | 4 amps; 125 sccm $O_2$ |
| Ion Source Operation for Material 2: | 2 amps; 100 sccm $O_2$ |
| Post Operation Bake (after completion of coating): | 550° C. in air one hour |

2. Glass Eyeglass Lenses

Figure 10:
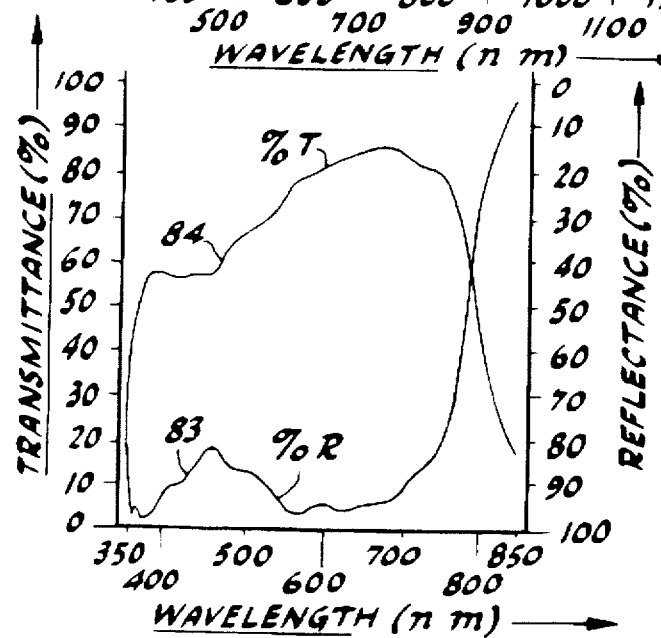

The apparatus described above and depicted in FIGS. 1–3 was also used in the single rotation mode to form a twenty-six layer optical quality coating comprising alternating layers of tantalum pentoxide and silicon dioxide on convex glass lenses using the process parameters of Table 2. As demonstrated by the percent reflectance curve 83 of FIG. 10 and the percent transmittance curve 84, also in FIG. 10, the coatings achieved the spectral performance design goals of providing a rejection band in the near infrared for filtering damaging infrared rays from the eyes as well as a rejection band in the ultraviolet and very high film durability characterized by the standard eraser rub, abrasion resistance test per MIL-C-675. In addition to the eye protecting features of the film, visible light is selectively filtered over the approximate range 400–700 nm by the coating design (layer thicknesses) to achieve different cosmetic coloring without substantially affecting visible light transmittance. This design requires stringent control of the optical thickness of the constituent layers to achieve stringent color reproducibility requirements. Product produced using our invention is a factor of two more uniform than product produced by prior art methods.

TABLE 2

| | |
|---|---|
| Substrate: | Glass Sunglass Lenses |
| Rotary Motion: | Single |
| Material 1: | Tantalum to form $Ta_2O_5$ |
| Material 2: | Silicon to form $SiO_2$ |
| C.R. 1: | 70 A/s |
| C.R. 2: | 90 A/s |
| Material 1 Gas: | Argon 400 sccm |
| Material 2 Gas: | Argon 400 sccm |
| Material 1 Power: | 6 KW |
| Material 2 Power: | 5 KW |
| Argon Sputter Pressure: | 2.5 microns |

TABLE 2-continued

| | |
|---|---|
| Ion Source Operation for Material 1: | 4 amps; 199 sccm $O_2$ |
| Ion Source Operation for Material 2: | 2 amps; 99 sccm $O_2$ |
| Post Operation Bake: | 450° C. in air one hour |

3. Plastic Eyeglass Lenses

Figure 11:
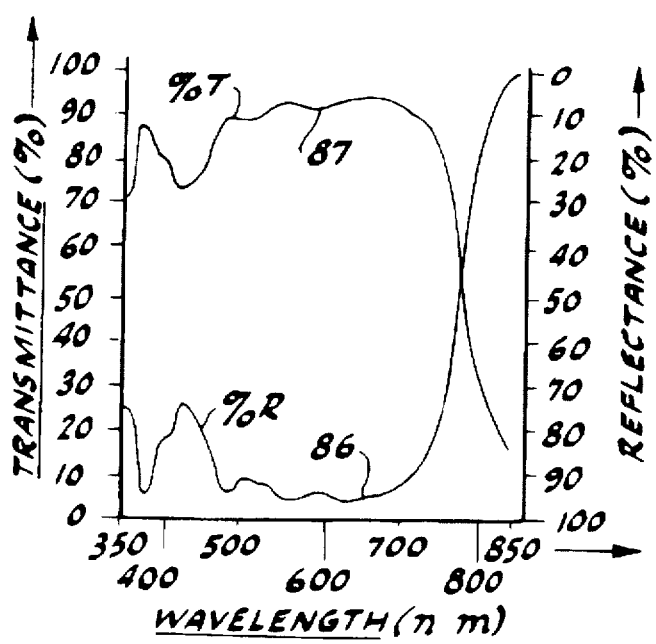

The apparatus depicted in FIGS. 1–3 was used in the single rotation mode with the process of Table 3 to deposit the same twenty-six layer blue filter film described in Example 2 having a rejection band in the near infrared for filtering damaging infrared rays from the eyes as well as a rejection band in the ultraviolet. However, the substrates in this case were plastic sunglass lenses rather than glass lenses. Referring to FIG. 11, as evidenced by the percent reflectance curve 86 and the percent transmittance curve 87, the thin film coatings achieved the optical design objectives discussed in Example No. 2 and the additional objective of deposition on the plastic without melting or softening the plastic, because the process temperature is very low, about 55° C. This demonstrated capability is in distinct contrast to all known prior art vacuum coating processes, for which the formation of multi-layer, durable, optically-transparent coatings on plastic substrates has traditionally been a difficult task. These thin film coatings also passed humidity exposure (MIL-M-13508) and snap tape adhesion tests (MIL-C-675).

TABLE 3

| | |
|---|---|
| Substrate: | Plastic Sunglass Lenses |
| Rotary Motion: | Single |
| Material 1: | Tantalum to form $Ta_2O_5$ |
| Material 2: | Silicon to form $SiO_2$ |
| C.R. 1: | 70 A/s |
| C.R. 2: | 90 A/s |
| Material 1 Gas: | Argon 400 sccm |
| Material 2 Gas: | Argon 400 sccm |
| Material 1 Power: | 3 KW |
| Material 2 Power: | 5 KW |
| Argon Sputter Pressure: | 2.5 microns |
| Ion Source Operation for Material 1: | 4 amps; 199 sccm $O_2$ |
| Ion Source Operation for Material 2: | 4 amps; 99 sccm $O_2$ |
| Post Operation Bake: | None |

4. Anti-Reflective Coatings for Plastic

Figure 12:
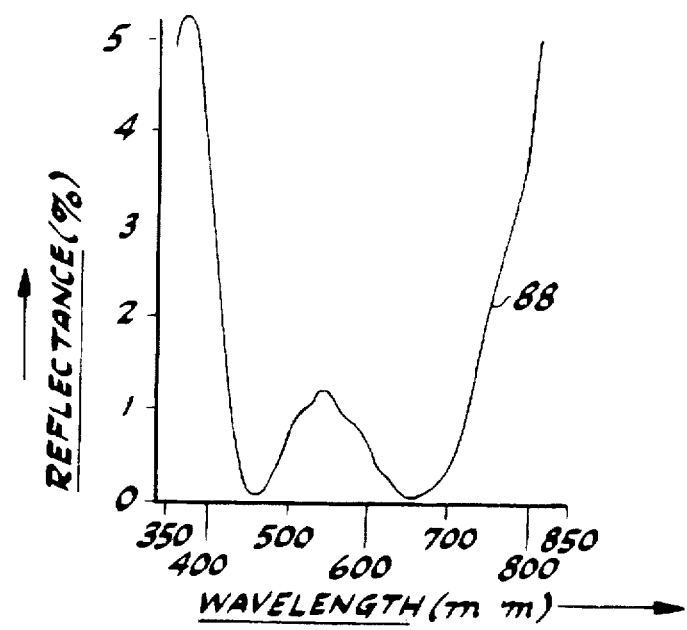

The apparatus described in FIGS. 1–3 was operated in the single rotation mode in accordance with the process shown in Table 4 to form four layer optical films comprising alternating layers of tantalum pentoxide and silicon dioxide on flat and convex curved plastic substrates using a process temperature of approximately 55° C. The films comprised four layers:

substrate|(HLHL)|ambient, where L=silicon dioxide and H=tantalum pentoxide and where the QWOT HLHL were centered, respectively, at 117 nm, 172 nm, 1096 nm and 520 nm. Referring to reflectance curve 88, FIG. 12, the films satisfied the design objectives of providing very low reflectance over the visible wavelength spectrum and depositing very thin (100 nm thick) layers with repeatability and without melting or softening the plastic.

TABLE 4

| | |
|---|---|
| Substrate: | Polycarbonate & Acrylic |
| Rotary Motion: | Single |
| Material 1: | Tantalum to form $Ta_2O_5$ |
| Material 2: | Silicon to form $SiO_2$ |
| C.R. 1: | 70 A/s |
| C.R. 2: | 90 A/s |
| Material 1 Gas: | Argon 400 sccm |
| Material 2 Gas: | Argon 400 sccm |
| Material 1 Power: | 3 KW |
| Material 2 Power: | 5 KW |
| Argon Sputter Pressure: | 2.5 microns |
| Ion Source Operation for Material 1: | 4 amps; 199 sccm $O_2$ |
| Ion Source Operation for Material 2: | 4 amps; 99 sccm $O_2$ |
| Post Operation Bake: | None |

5. Yellow Headlamp Filter Coating

Figure 13:
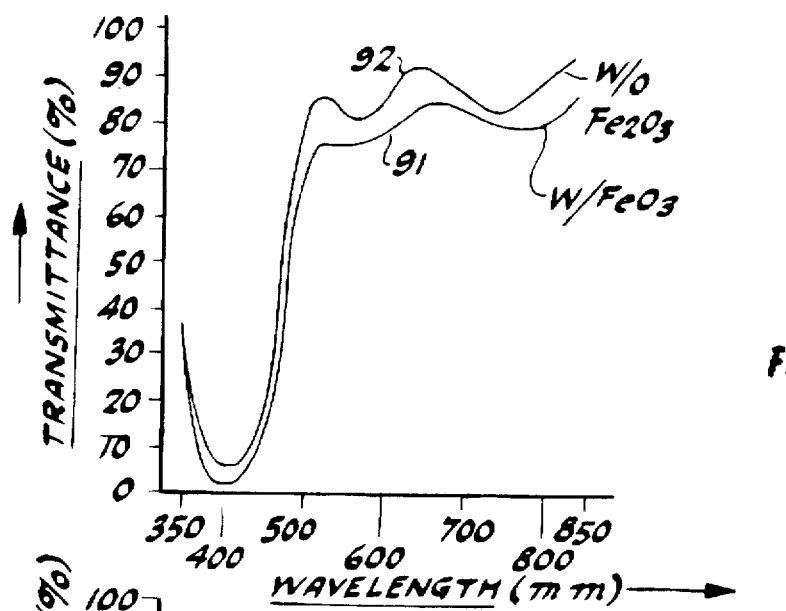

The apparatus depicted in FIGS. 1–3 was also used to deposit fourteen layer films on the quartz envelopes of halogen headlamp bulbs using the double rotation mode and the process of Table 5. The films incorporate three materials, require precise color matching of the multiple materials and require precise control of the constituent thin one-quarter wave layers. As a consequence, the film design is a difficult one to implement. The specific film design was:

substrate|$Fe_2O_3(H)(LH)^6$|ambient, where L=silicon dioxide and H=tantalum pentoxide and the QWOT $Fe_2O_3$, H and (LH) were centered, respectively, at 14 nm, 10 nm and 430 nm. The films demonstrated the ability to reproducibly deposit a multi-layer blue filter of design $Fe_2O_3$ $(H)(LH)^6$ on the quartz envelope. The $Fe_2O_3$ was used here as a selective absorber. The spectral performance of these films is depicted in FIG. 13. Curve 91 depicts percent transmittance when the $Fe_2O_3$ absorber layer is used; curve 92 describes the performance without the $Fe_2O_3$ layer. FIG. 13 demonstrate that the combination of the multi-layer blue filter and the $Fe_2O_3$ selective absorber transmits yellow light over the range of approximately 500–600 nm and blocks the transmission of blue light at about 450 nm and eliminates the characteristic blue corona associated with high angle reflectance and subsequent transmittance through the glass envelope.

TABLE 5

| | |
|---|---|
| Substrate: | Halogen Lamp Envelopes |
| Rotary Motion: | Double (planetary) |
| Material 1: | Tantalum to form $Ta_2O_5$ |
| Material 2: | Silicon to form $SiO_2$ |
| C.R. 1: | 150 A/s |
| C.R. 2: | 100 A/s |
| Material 1 Gas: | Argon 400 sccm |
| Material 2 Gas: | Argon 400 sccm |
| Material 1 Power: | 6 KW |
| Material 2 Power: | 5 KW |
| Argon Sputter Pressure: | 2.5 microns |
| Ion Source Operation for Material 1: | 1 amp; 200 sccm $O_2$ |
| Ion Source Operation for Material 2: | 1 amp; 100 sccm $O_2$ |
| Post Operation Bake: | 600° C. in air one hour |

6. Thin Hot Mirror Coatings

Figure 14:
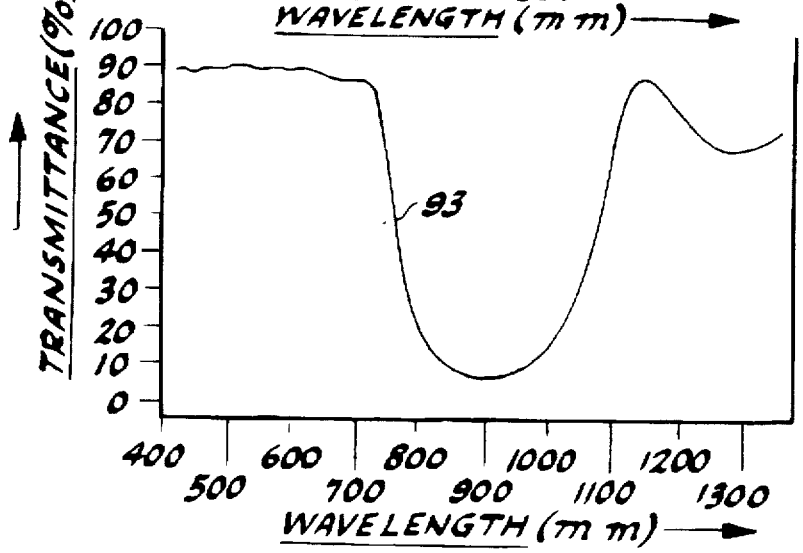

The apparatus depicted in FIGS. 1–3 was operated in the double-rotational mode to form fifteen-layer films on tubular quartz lamp envelopes used in infrared (IR) radiant energy heating lamps. The coatings are termed "thin hot mirror" because they are designed to transmit visible energy while reflecting infrared energy emitted by the internal tungsten halogen filament. The coating 2 leads to lamp power reduction because the infrared energy is geometrically incident on the lamp filament. The energy is used to heat the filament, thereby decreasing the amount of electrical power required to operate the lamp. The specific film design was:

substrate|(L/2 H L/2)$^5$|ambient=900 nm where L is silicon dioxide, H is tantalum pentoxide and the QWOT was centered at 900 nm. The spectral performance of these films is depicted in FIG. 14. Curve 93 depicts percent transmittance as a function of wavelength and demonstrates that the hot mirror film or coating transmits visible light over the range of approximately 400–750 nm and reflects IR energy over the approximate range 750–1100 nm back to the filament.

TABLE 6

| Substrate: | 10 mm Quartz tubes |
|---|---|
| Rotary Motion: | Double (planetary) |
| Material 1: | Tantalum to form Ta$_2$O$_5$ |
| Material 2: | Silicon to form SiO$_2$ |
| C.R. 1: | 150 A/s |
| C.R. 2: | 100 A/s |
| Material 1 Gas: | Argon 400 sccm |
| Material 2 Gas: | Argon 400 sccm |
| Material 1 Power: | 6 KW |
| Material 2 Power: | 5 KW |
| Argon Sputter Pressure: | 2.5 microns |
| Ion Source Operation for Material 1: | 2 amps; 199 sccm O$_2$ |
| Ion Source Operation for Material 2: | 2 amps; 99 sccm O$_2$ |
| Post Operation Bake: | 600° C. in air one hour |

Having thus described previous preferred and alternative embodiments of our invention, it will be appreciated that those of usual skill in the art will readily modify and extend the described invention based upon the disclosure here and within the scope of the following claims.

We claim:

1. A process for forming optical thin film coatings, comprising: providing a substrate having a curved surface and sputter depositing on the curved surface a thin film coating while moving the substrate along a path selected for controlling the thickness profile of the thin film coating; providing a locally intense reactive plasma and chemically reacting substantially the entire thickness of the deposited thin film coating with the reactive plasma, the chemical reaction step being sequential in space relative to the sputter deposition step; and repeating the deposition and chemical reaction steps to form an optical thin film on the curved surface of the substrate having optical properties equivalent to those associated with formation on a flat substrate.

2. The process of claim 1, wherein the coating is selected from metal oxides, metal nitrides and other reacted metal compounds.

3. The process of claim 1, wherein the thin film is selected from oxide, nitride, hydride, carbon-containing compounds and alloys and composites thereof.

4. The process of claim 1, wherein the thin film is a metal oxide.

5. A process for forming optical quality thin film coatings, comprising: providing a substrate having a curved surface; sputter depositing a thin metal coating on said curved surface using an instantaneous rate of about 100–150 Angstroms/second and converting the metal to an oxide having optical qualities equivalent to those associated with formation on a flat substrate, while moving the substrate along a selected path for controlling the thickness profile of the metal oxide coating.

6. A process for forming a thin film on a substrate in a vacuum chamber, comprising: rotating the substrate about at least one axis and through processing zones within the chamber; at a first processing zone, sputter depositing onto the substrate a thin coating of material; at a second processing zone, providing a locally intense reactive plasma and chemically reacting substantially the entire thickness of the deposited material with the reactive plasma, the chemical reaction step being sequential in space relative to the sputter deposition step; and repeating the deposition and chemical reaction steps to form an optical thin film on the substrate.

7. A process for forming a thin film on a substrate in a vacuum chamber, comprising: providing a substrate support; mounting a plurality of substrates on the support; rotating the substrate support about at least one axis and through processing zones within the chamber; at a first processing zone, sputter depositing onto the substrates a thin coating of material; at a second zone, providing a locally intense reactive plasma and chemically reacting substantially the entire thickness of the deposited material with the reactive plasma, the chemical reaction step being sequential in space relative to the sputter deposition step; and repeating the deposition and chemical reaction steps to form an optical thin film on the substrates.

8. The process of claim 7, further comprising: during the deposition step, controlling at least one of the following parameters to control the center-to-edge thickness of the deposited coating of material: the total system pressure, the kinetic energy of the sputtered material, the mass of the sputtered material, the mass of the working gas used in the sputter deposition process, and the sputter target-to-substrate distance.

9. The process of claim 8, wherein the selected parameter or parameters are controlled to provide a uniform thickness.

10. The process of claim 8, wherein the selected parameter or parameters are controlled to provide a controlled non-uniform thickness.

11. The process of claim 8, wherein the film thickness profile is controlled by varying target power inversely relative to the target-to-substrate distance during rotation of the substrate past the target.

12. The process of claim 8, wherein the substrate is convex.

13. The process of claim 8, wherein the substrate is cylindrical.

14. The process of claim 8, wherein the substrate is bulb-shaped.

15. The process of claim 8, wherein the substrate is tubular.

16. The process of claim 8, wherein the substrate is concave.

17. The process of claim 8, wherein the thin film is selected from oxide, nitride, hydride, carbon-containing compounds and alloys and composites thereof.

18. The process of claim 8, wherein the thin film is a metal oxide.

* * * * *